(12) United States Patent
Fukuzono

(10) Patent No.: US 7,787,257 B2
(45) Date of Patent: Aug. 31, 2010

(54) PRINTED WIRING BOARD UNIT

(75) Inventor: Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 12/362,149

(22) Filed: Jan. 29, 2009

(65) Prior Publication Data
US 2009/0196002 A1 Aug. 6, 2009

(30) Foreign Application Priority Data
Feb. 5, 2008 (JP) ............................. 2008-024786

(51) Int. Cl.
*H05K 7/00* (2006.01)
(52) U.S. Cl. ................... 361/760; 361/794; 361/799
(58) Field of Classification Search ........... 361/760, 361/794, 799, 767, 807, 810, 736, 748, 720, 361/743, 785; 257/776, 777, 778; 174/252, 174/261, 262
See application file for complete search history.

(56) References Cited

U.S. PATENT DOCUMENTS
5,653,598 A * 8/1997 Grabbe ......................... 439/66
7,114,960 B2 * 10/2006 Rathburn ...................... 439/66
2004/0027810 A1 * 2/2004 Phalen ......................... 361/748

FOREIGN PATENT DOCUMENTS
JP 2003-031614 A 1/2003
JP 2004-241594 A 8/2004

* cited by examiner

*Primary Examiner*—Hung S Bui
*Assistant Examiner*—Andargie M Aychillhum
(74) *Attorney, Agent, or Firm*—Arent Fox LLP

(57) ABSTRACT

A printed wiring board unit includes an electronic circuit component, a printed wiring board, a plurality of first conductive terminals disposed between the electronic circuit component and the printed wiring board, at least one of the first conductive terminals arranged along a quadrangular outline, and a plurality of second conductive terminals disposed between the electronic circuit component and the printed wiring board, the second conductive terminals arranged at a corner of the quadrangular outline, and the second conductive terminals contacting at least one of the printed wiring board and the electronic circuit component in a relatively displaceable manner.

9 Claims, 13 Drawing Sheets

PRINTED WIRING BOARD UNIT

CROSS-REFERENCE TO APPLICATION

This application is based upon and claims the benefit of priority of prior Japanese Patent Application No. 2008-24786 filed on Feb. 5, 2008, the entire contents of which are incorporated herein by reference.

BACKGROUND

1. Field

Aspects of the invention relate to a printed wiring board unit comprising a printed wiring board and an electronic part mounted on the printed wiring board.

2. Description of the Related Art

Mother boards have printed wiring boards. Packages of electronic circuit components such as LSI chip packages are mounted on the printed wiring board. The electronic circuit components are mounted with a ball grid array (BGA). The BGA is a package of solder bumps arranged in a matrix between printed wiring boards and a package substrate included in an LSI chip package. The package of solder bumps includes an array of bumps arranged along a rectangular outline of the printed wiring board.

[Patent Document 1]
Japanese Laid-open Patent Publication No. 2004-241594

[Patent Document 2]
Japanese Laid-open Patent Publication No. 2003-31614

The printed wiring boards are made of, for example, resin boards. Package substrates of the electronic circuit components are made of, for example, rectangular ceramic substrates. Thus, a thermal expansion rate of the package substrate is greatly different from that of the printed wiring board. Different thermal expansion rates occur between the printed wiring board and the package substrate during temperature changes. The difference of the thermal expansion rates peaks on diagonal lines of the package substrate. Consequently, the greatest stress is produced at a solder bump arranged at a corner of the rectangular package substrate. The stress repeatedly subjected to the solder bump eventually causes a solder crack.

Aspects of the present invention solve the issue described above. An object of the present invention is to provide a printed wiring board unit, a semiconductor package, and a connector for the semiconductor package for maintaining a connection between a printed wiring board and an electronic circuit component regardless of such stress.

SUMMARY

According to an aspect of an embodiment, a printed wiring board unit includes an electronic circuit component, a printed wiring board, a plurality of first conductive terminals disposed between the electronic circuit component and the printed wiring board, some of the first conductive terminals arranged along a quadrangular outline, and a plurality of second conductive terminals disposed between the electronic circuit component and the printed wiring board, the second conductive terminals being arranged at a corner of the quadrangular outline, and the second conductive terminals contacting at least one of the printed wiring board and the electronic circuit component in a relatively displaceable manner.

The object and advantages of the aspects in accordance with the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE EMBODIMENTS

The first embodiment in accordance with aspects of the present invention will be disclosed with reference to the accompanying drawings.

Figure 1:
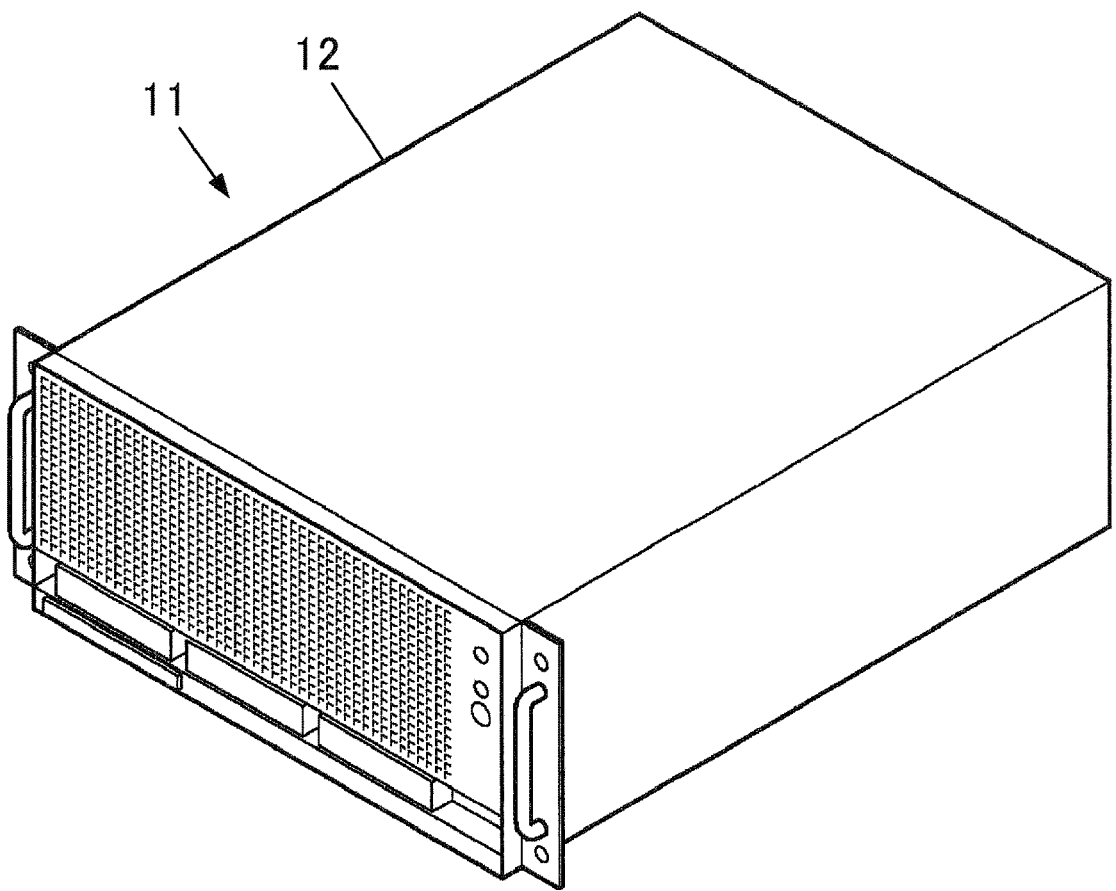
FIG. 1 is a perspective view of an appearance of an embodiment of an electronic device.

FIG. 1 illustrates the appearance of the embodiment of the electronic device, server computer 11, schematically. Server computer 11 has enclosure 12. Enclosure 12 encloses a storage space therein. The storage space houses a printed wiring board unit called a mother board, which will be described in more detail later. A semiconductor package called large-scale integration circuit (LSI) chip package and a main memory are mounted on the mother board.

The LSI chip package executes, for example, various operations with software programs according to data stored in the main memory temporary. The software programs and the data may be stored in a hard disk drive (HDD) housed in the storage space together with the other components. Server computer 11 is mounted in, for example, a rack.

Figure 2:
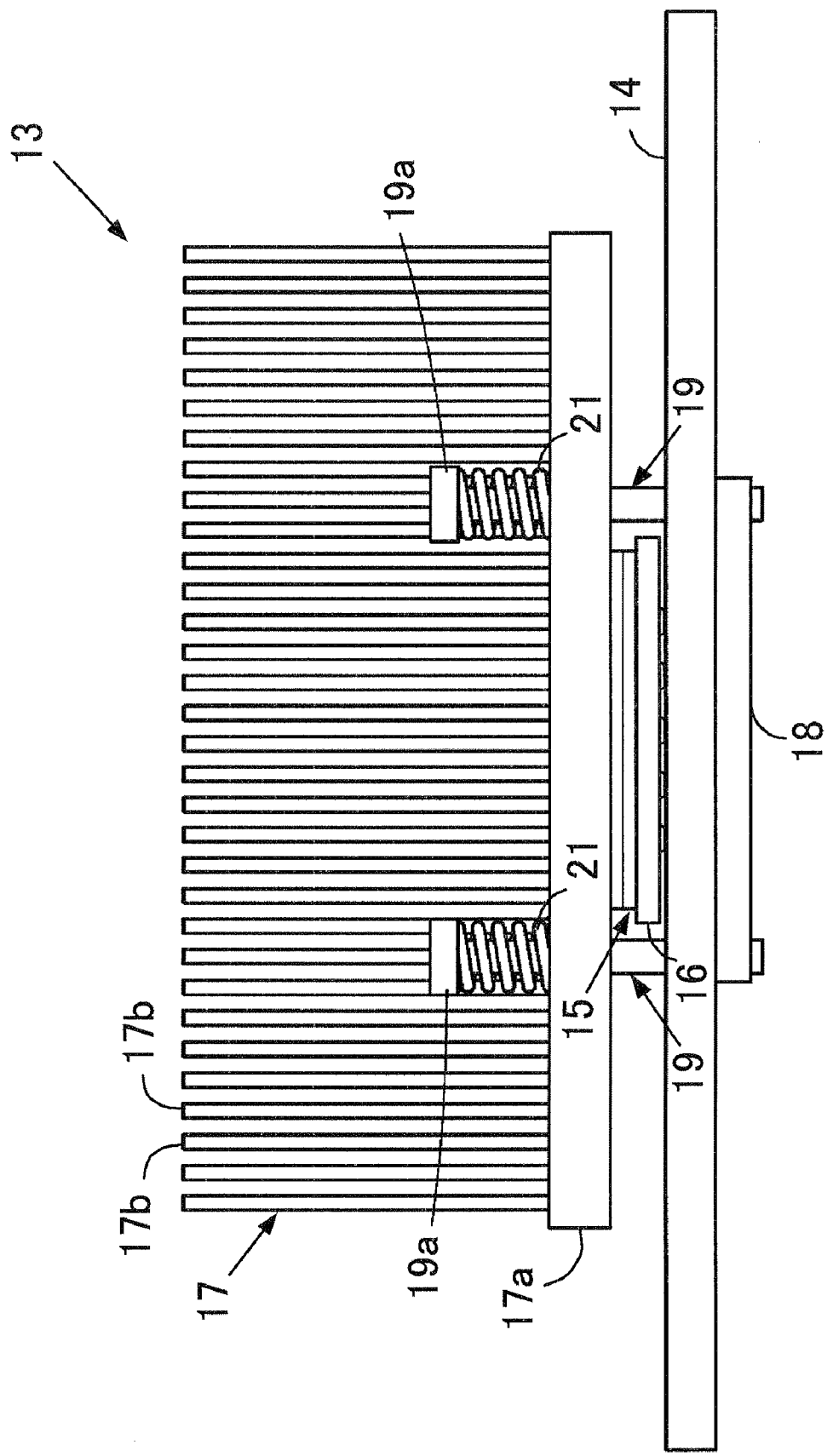
FIG. 2 illustrates a structure of a printed wiring board unit according to the first embodiment in accordance with aspects of the present invention.

FIG. 2 illustrates the structure of mother board 13 according to the first embodiment in accordance with aspects of the present invention, schematically. Mother board 13 has printed wiring board 14. The printed wiring board 14 is made from, for example, resin. The electronic circuit components, such as an LSI chip package 15, are mounted on the printed wiring board 14. The LSI chip package 15 defines, for example, a square underside. Semiconductor package connector 16 is inserted between the LSI chip package 15 and the printed wiring board 14. LSI chip package 15 and connector 16 are described later in detail.

Heat sink 17 is mounted on LSI chip package 15. Heat sink 17 has base plate 17a, which extends over the top surface of LSI chip package 15 in parallel. Multiple fins 17b stand perpendicularly from base plate 17a. Fins 17b extend horizontally to each other. Flow passages formed between fins 17b produce flows of air. Heat sink 17 sandwiches LSI chip package 15 with printed wiring board 14. Heat sink 17 may be made from, for example, metallic material such as aluminum or copper.

Bolster plate 18 is connected with heat sink 17. Bolster plate 18 is affixed on the underside of printed wiring board 14. Heat sink 17 and bolster plate 18 are attached on printed wiring board 14 with four bolts 19. Each bolt 19 penetrates base plate 17a and printed wiring board 14. Each bolt 19 is situated outside of a corner of LSI chip package 15. Each bolt 19 may be situated on extensions of the diagonal lines of the underside of LSI chip package 15.

Elastic member 21 is inserted between bolt head 19a of bolt 19 and base plate 17a included in heat sink 17. Elastic members 21 may be, for example, helical springs. The helical spring is biased between bolt head 19a and base plate 17a. Thus, heat sink 17 and base plate 17a are pressed against printed wiring board 14 with a certain pressure.

Figure 3:
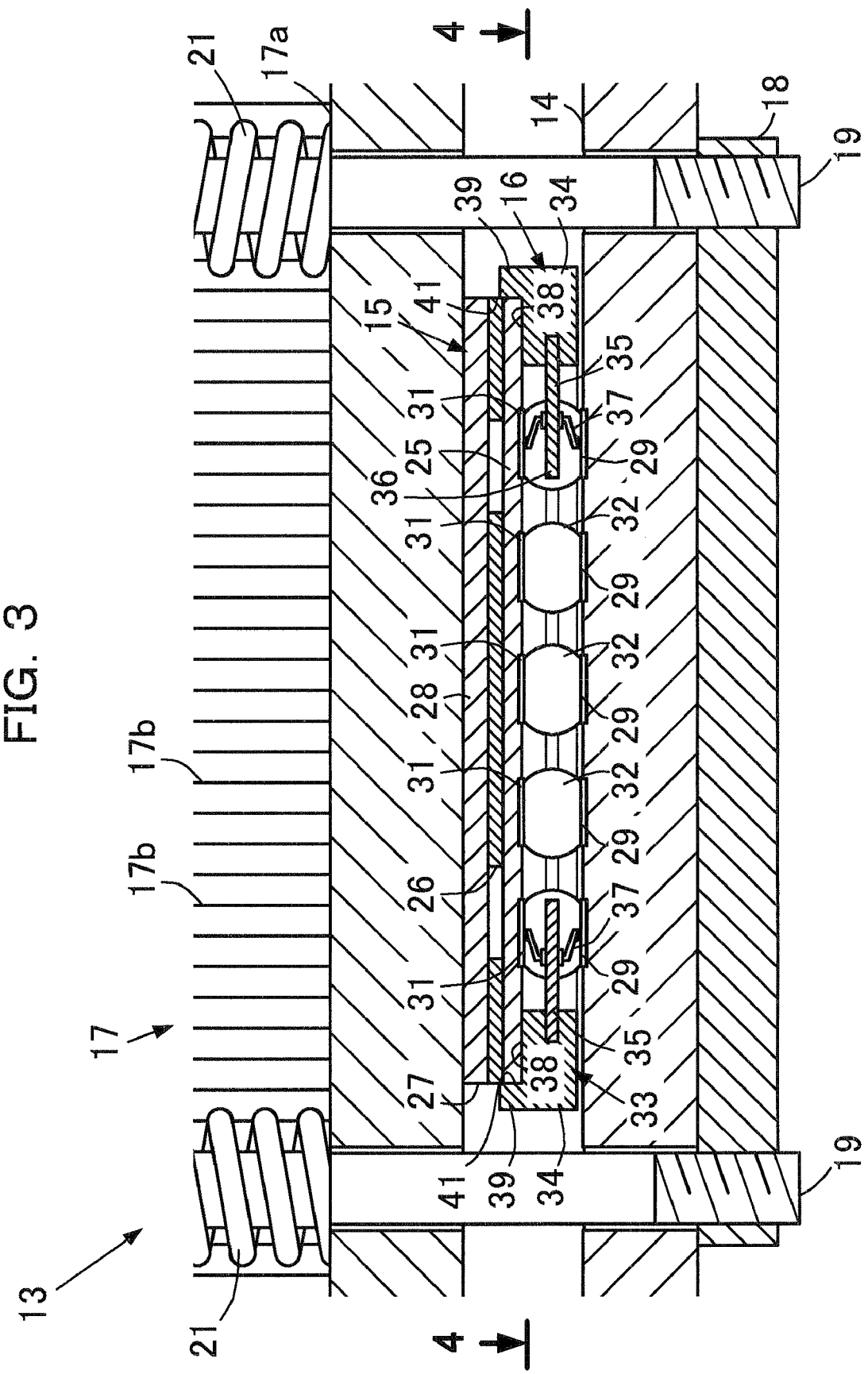
FIG. 3 is a vertical sectional view schematically illustrating a part of a structure of the printed wiring board unit according to the first embodiment in accordance with aspects of the present invention.

LSI chip package 15 has package substrate 25 as shown in FIG. 3. Package substrate 25 is made from, for example, ceramic. A semiconductor chip, such as LSI chip 26, is mounted on package substrate 25. A stiffening member, stiffener 27, is affixed around LSI chip 26 on package substrate 25. Stiffener 27 surrounds, for example, LSI chip 26 continuously. Stiffener 27 is made from metallic material such as copper.

A thermal conducting member, head spreader 28, is mounted on LSI chip 26 and stiffener 27. Heat spreader 28 is made from, for example, metallic material such as copper. Other thermal conducting members such as thermal conduction paste may be inserted between LSI chip 26 and heat spreader 28. These thermal conducting members increase a contact area between LSI chip 26 and heat spreader 28.

Conductive pads 29 are arranged in a matrix on printed wiring board 14. Likewise, conductive pads 31 are arranged in a matrix on an underside of package substrate 25. Each conductive pad 29 arranged on printed wiring board 14 corresponds to one of conductive pads 31 arranged on the underside of package substrate 25 in a one-to-one relation. Conductive pad 29 is connected with conductive pad 31 through the first conductive terminal 32. In this manner, the first conductive terminals 32 are connected with printed wiring board 14 and package substrate 25b.

Figure 4:
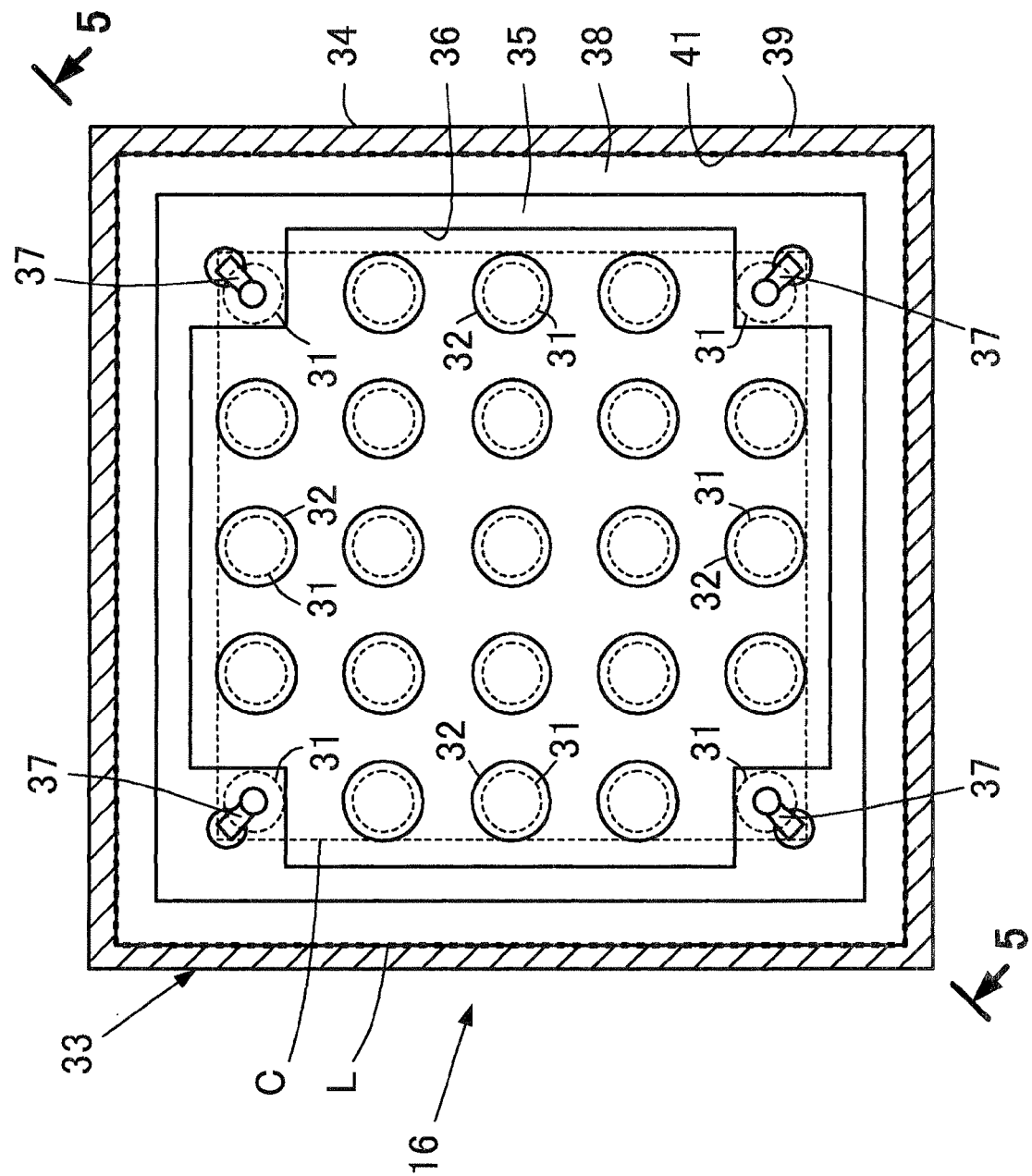
FIG. 4 is an enlarged sectional view of the printed wiring board unit, which is sectioned with 4-to-4 line shown in FIG. 3.

Conductive pads 29 and 31 are arranged in a matrix with 5 rows and 5 columns as shown in FIG. 4. The first conductive terminals 32 include conductive terminals arranged along the outline C formed in a quadrangle. In this embodiment, outline C is in a square shape. The first conductive terminals 32 are arranged in a matrix excluding corners of the quadrangle. The first conductive terminals 32 are made of, for example, solder bumps. The solder bumps are made from alloy of, for example, tin, silver and copper.

Connector 16 has connector frame 33. Connector frame 33 has support frame 34 extending along an outline of package substrate 25. Support frame 34 supports support plate 35 with its inner edge. Support plate 35 extends parallel to printed wiring board 14 and package substrate 25. Aperture 36, which is formed in a shape modeled after the quadrangle outline C, is provided on support plate 35. Support plate 35 supports the second conductive terminals 37. The second conductive terminals 37 are situated at positions corresponding to the corners of the square aperture. The second conductive terminals 37 are situated at each corner of the quadrangle outline. The both ends of the second conductive terminal 37 are held with conductive pads 31 and 29, respectively.

Support frame 34 holds the underside of package substrate 25 with bearing face 38 formed around aperture 36 flatly. The outer edge of bearing face 38 is defined with outline L modeled after the outline of package substrate 25. Positioning frame 39 extending along the outline of package substrate 25 is attached to support frame 34. Positioning frame 39 may be integrated with support frame 34. Positioning frame 39 defines restriction wall 41 standing from bearing face 38 along outline L of bearing face 38. Restriction wall 41 surrounds the outer edge of package substrate 25 continuously. Package substrate 25 is guided into place on connector frame with restriction wall 41.

In this embodiment, a given clearance may be kept between the underside of support frame 34 and the surface of printed wiring board 14. Support frame 34, support plate 35 and positioning frame 39 are made from, for example, resin material having a high thermal resistance excluding thermoplastic resin. The resin material described above keeps its original form when heated at a melting temperature of the first conductive terminal 32 in a reflow furnace later described. Thus, melting or deformation of support frame 34, support plate 35 and positioning frame 39 may be avoided. Representative of the resin material is epoxy resin. Support plate 35 may have flexibility.

Figure 5:
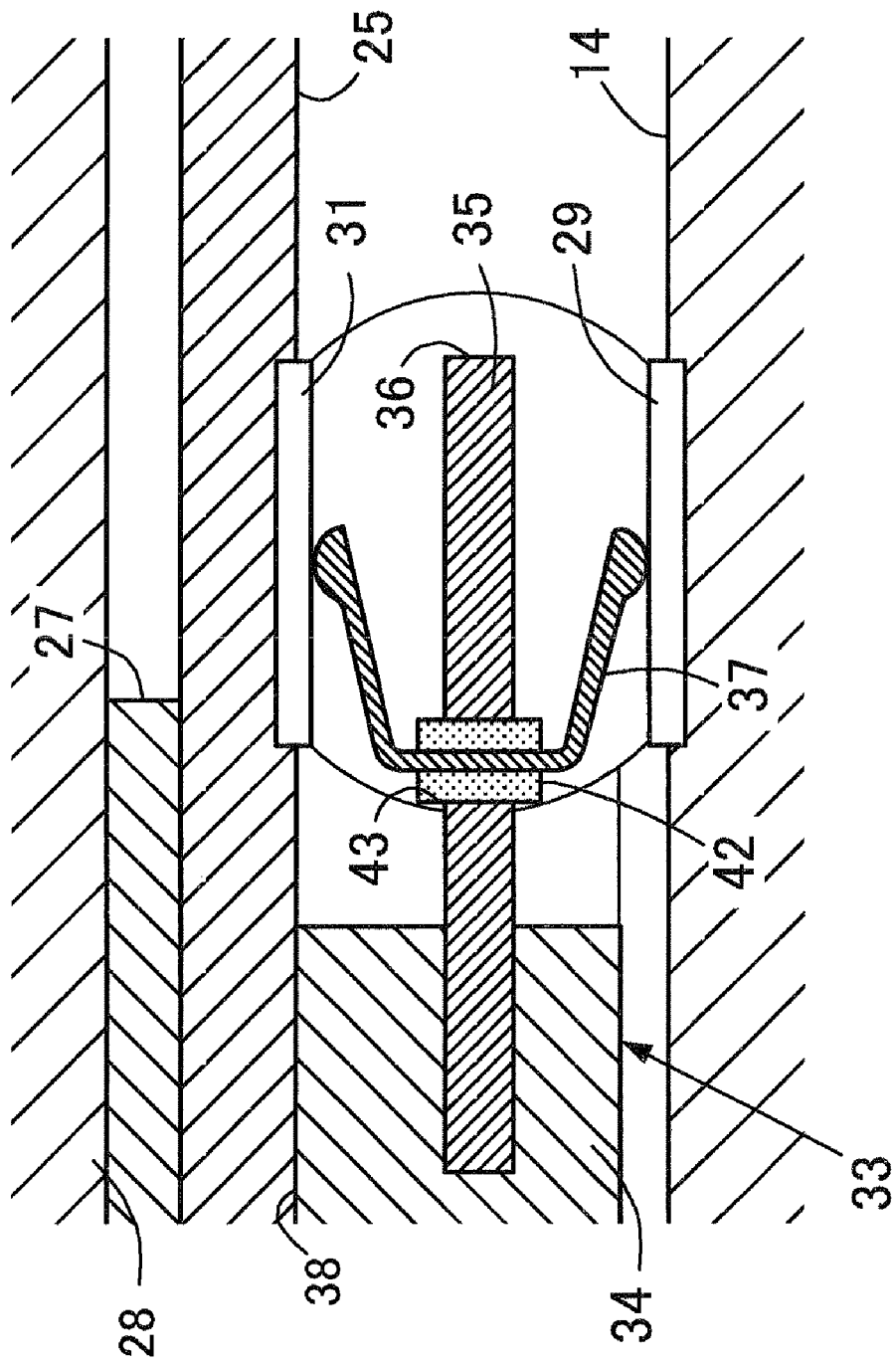
FIG. 5 is an enlarged sectional view of the printed wiring board unit sectioned with 5-to-5 line shown in FIG. 4.

The second conductive terminal 37 is made of an elastic member, in other words, a plate spring as shown in FIG. 5. The second conductive member 37 is inserted into insulation 42 made from elastic material such as gum. Insulation 42 is inserted into through hole 43 formed on support plate 35. The second conductive terminal 37 is bended at a given angle so as to stand from the surface and underside of support plate 35. Therefore, the each end of the second conductive terminal 37 is pressed against conductive pad 29 arranged on printed wiring board 14 and conductive pad 31 arranged on package substrate 25, respectively, with a given pressure.

For a mother board 13, as described above, an LSI chip produces heat during operation. The heat produced by the LSI chip 26 is conducted to the package substrate 25 and the printed wiring board 14. Ceramic substrates are used for package substrates 25, whereas resin substrates are used for printed wiring boards 14. The thermal expansion rates of the two materials are very different. Consequently, a stress forms between package substrate 25 and printed wiring board 14 during temperature changes. This stress reaches its peak at the corners of the quadrangle.

As described earlier, the second conductive terminals 37 are situated at the corners of the quadrangle. The ends of the second conductive terminal 37 are pressed against conductive pads 29 and 31, respectively, with the given pressure. Thus, the ends of the second conductive terminal 37 are relatively flexible against conductive pads 29 and 31 when there is the difference of thermal expansion rates between printed wiring board 14 and package substrate 25. Therefore, the second conductive terminal 37 maintains with conductive pads 29 and 31 throughout temperature changes. Thus, a connection between LSI chip package 15 and printed wiring board 14 is maintained.

Figure 6:
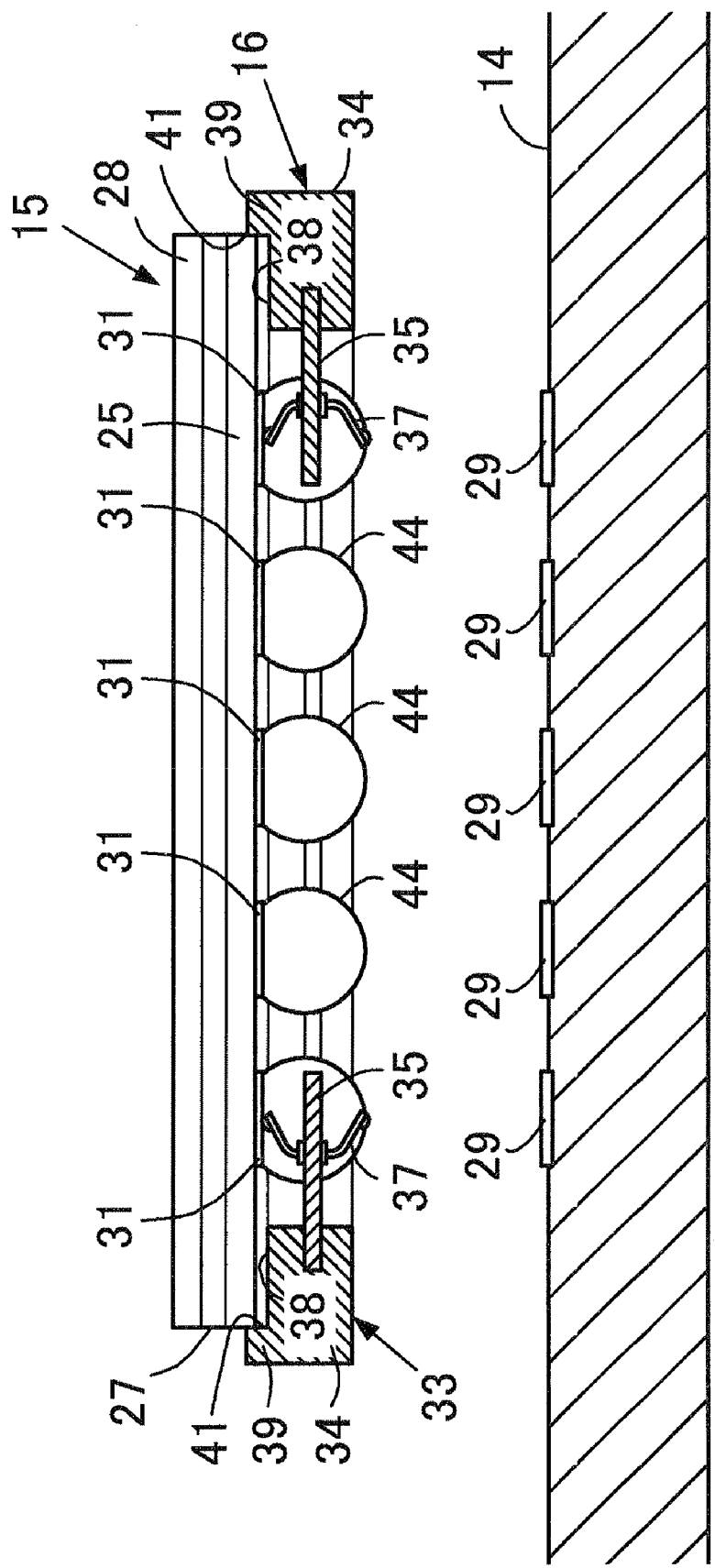
FIG. 6 is a vertical sectional view of the printed wiring board on which a semiconductor package and a connector are laid out.

Next, an assembling process of mother board 13 will be described. As shown in FIG. 6, an LSI chip package 15 may be used. Solder balls 44 are first applied to conductive pads 31 excluding the conductive pads situated at the corners. Package substrate 25 is then fitted into support frame 34 included in package substrate 25. The package substrate 25 is fitted into a support frame 34 included in the connector frame 33. Restriction wall 41 guides LSI chip package 15 into place on the connector frame 33. Therefore, the end of the second conductive terminal 37 are held with conductive pad 31 on a surface of support plate 35. Thus, connector 16 is integrated with LSI chip package 15.

Figure 7:
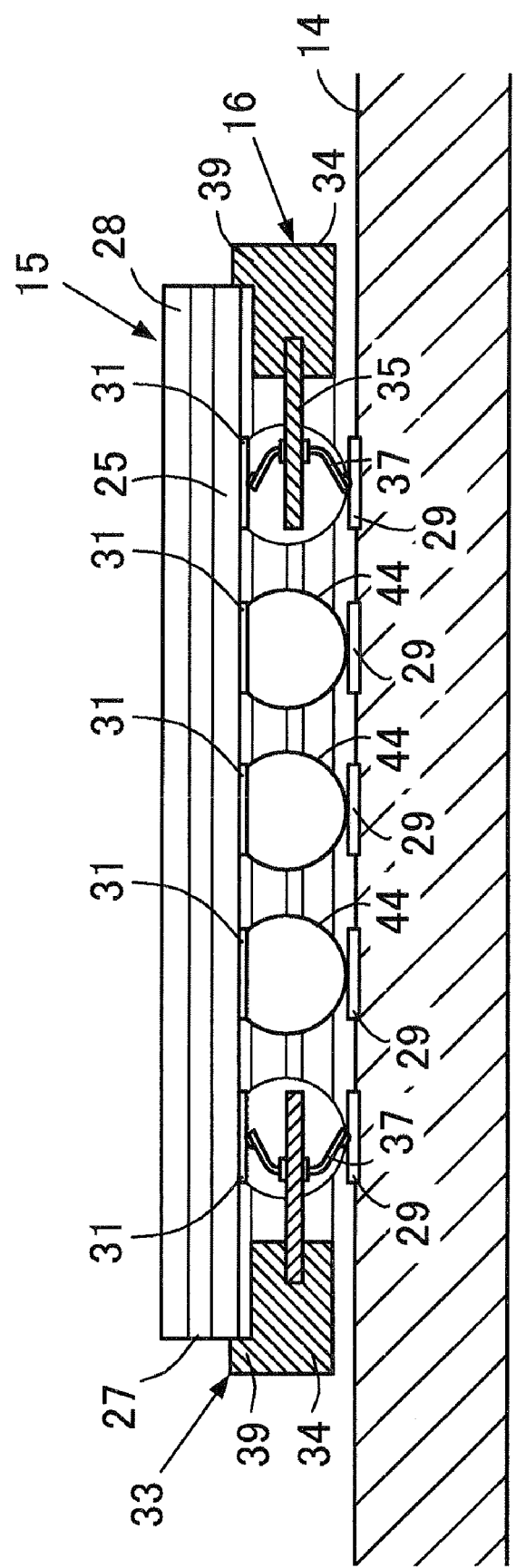
FIG. 7 is a vertical sectional view of the printed wiring board on which the semiconductor package and the connector are laid out.

As shown in FIG. 7, LSI chip package 15 and connector 16 are mounted at a given position on printed wiring board 14. Solder balls 44 and the second conductive terminals 37 are held with conductive pads 29 arranged on printed wiring board 14 under a weight of, for example, LSI chip package 15. LSI chip package 15 and connector 16 are put in a reflow furnace. If the elasticity of the ends of the second conductive terminal 37 is high, a given weight is loaded on LSI chip package 15.

A temperature in the reflow furnace is set to 260 degree Centigrade temperature. While solder balls 44 melt at such a temperature, support frame 34 and support plate 35 having a higher thermal resistances are not deformed or melted in any degree. After heating, solder balls 44 become hardened by cooling. In this manner, solder balls 44 adhere to conductive pads 31. Therefore, conductive pads 29 and 31 are connected through the first conductive terminals 32 reciprocally. Then, heat sink 17 is attached on the LSI chip package 15.

Figure 8:
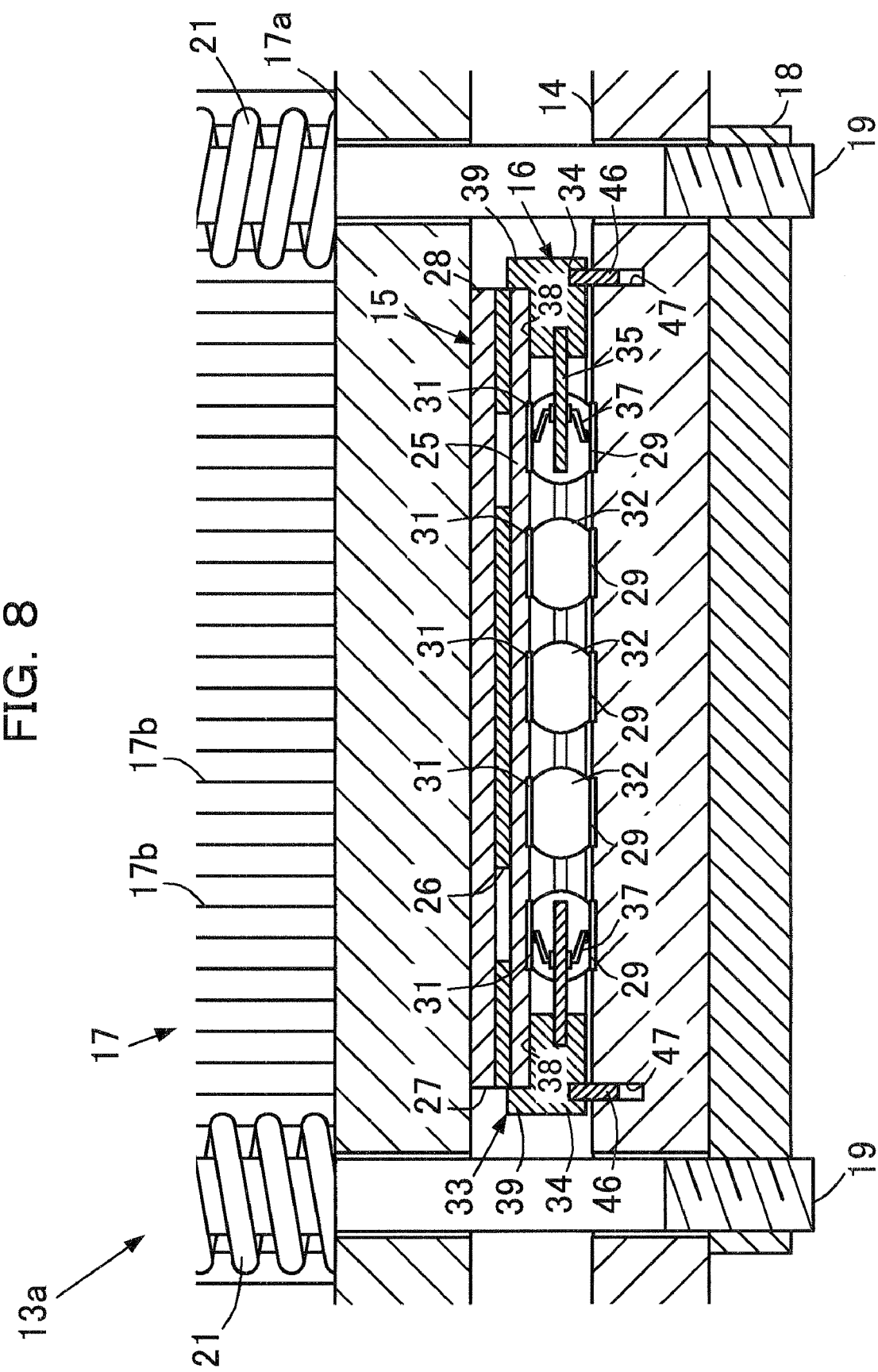
FIG. 8 is a vertical sectional view schematically illustrating a structure of a printed wiring board unit according to the second embodiment in accordance with aspects of the present invention.

FIG. 8 schematically illustrates the structure of mother board 13a according to a second embodiment in accordance with aspects of the present invention. For mother board 13a, positioning members, positioning pins 46, are coupled to support frame 34. Positioning pins 46 are projected from the underside of support frame 34. Positioning pins 46 are provided, for example, at four corners of the underside of support frame 34. Positioning pins 46 are inserted into receiving holes 47 formed on the surface of the printed wiring boards 14. Components and a structure identical to those of mother board 13 are given the same reference numbers. Mother board 13a may function similarly to mother board 13 described early.

Figure 9:
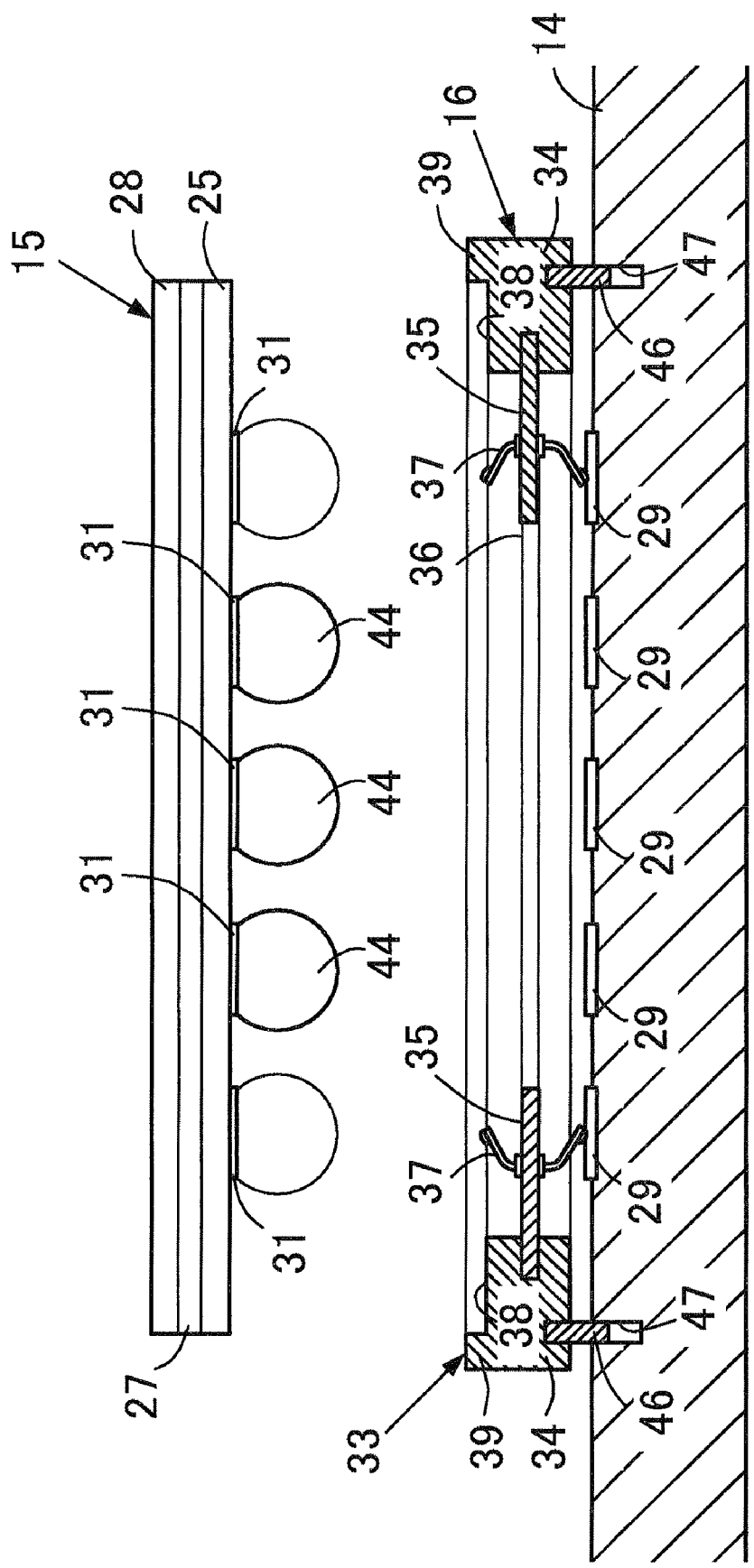
FIG. 9 is a vertical sectional view illustrating the printed wiring board on which a connector is laid out.

Connector 16 is provided on printed wiring board 14 in assembling mother board 13a as shown in FIG. 9. Positioning pins 46 are inserted into receiving holes 47 formed on printed wiring board 14. With positioning pins 46, connector 16 is positioned on printed wiring board 14. At the same time, the ends of the second conductive terminals 37 are held with conductive pads 29 arranged on printed wiring board 14. Then, LSI chip package 15 is fitted into support frame 34. As describe above, LSI chip package 15 may be mounted on printed wiring board 14 by reflowing. In this manner, mother board 13a is assembled.

Figure 10:
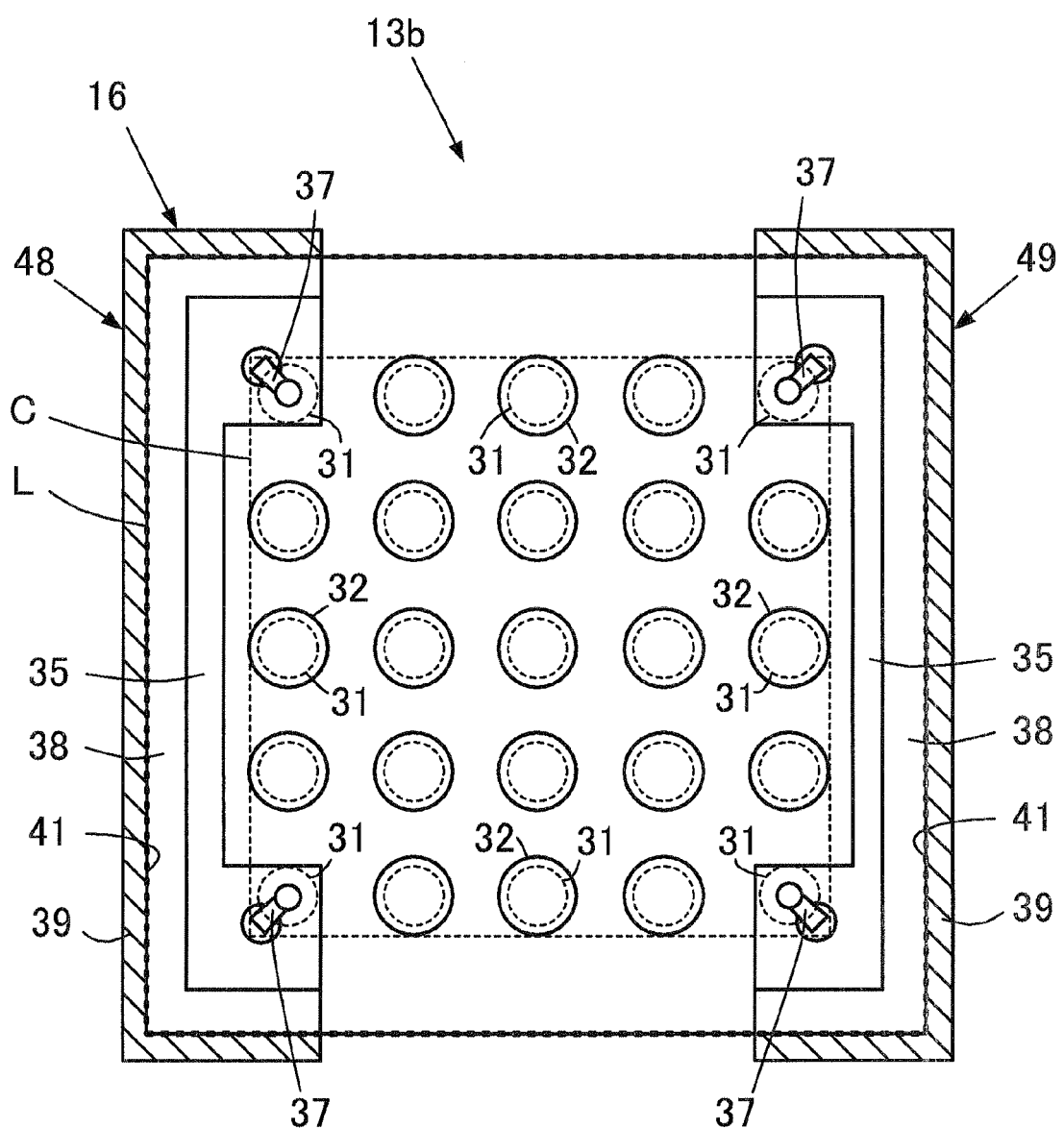
FIG. 10 is an enlarged sectional view schematically illustrating a structure of a printed wiring board according to the third embodiment in accordance with aspects of the present invention.

FIG. 10 illustrates the structure of mother board 13b according to the third embodiment in accordance with aspects of the present invention schematically. For mother board 13b shown in FIG. 10, the first support frame 48 and the second support frame 49 are equivalent to support frame 34 described previously. The first and second support frames 48 and 49 extend along the outline corresponding to two sides of package substrate 25, which oppose each other. Each support plate 35 provides two of the second conductive terminals 37, respectively. Components and a structure identical to those of mother board 13 described before are given the same reference numbers. Mother board 13b described above may function similarly to mother board 13.

Figure 11:
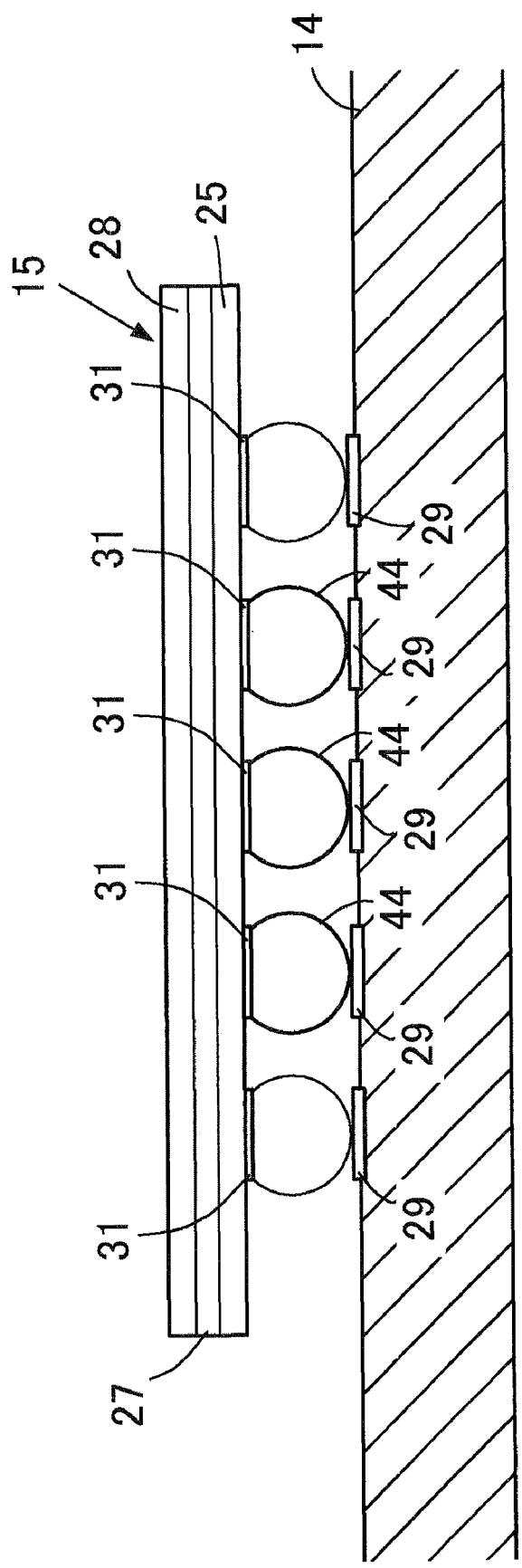
FIG. 11 is a vertical sectional view schematically illustrating the printed wiring board on which a semiconductor package is laid out.

LSI chip package 15 is mounted at a given position on printed wiring board 14 in assembling mother board 13b as shown in FIG. 11. Solder balls 44 are first applied to conductive pads 31 arranged on package substrate 25 excluding ones situated at the corners of package substrate 25. Then, the LSI chip package 15 is held with conductive pads 31 arranged on the underside of LSI chip package 15 and conductive pads 29 arranged on the top face of printed wiring board 14b. Then, the solder balls 44 are melted in the reflow furnace. In this manner, LSI chip package 15 is mounted on printed wiring board 14 through the first conductive terminals 32.

Figure 12:
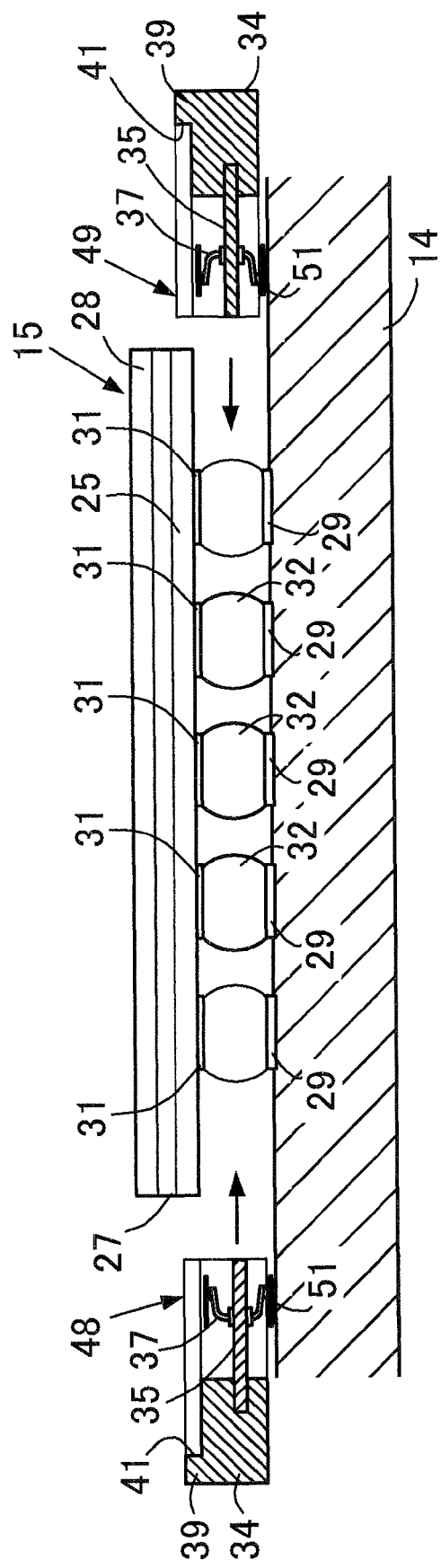
FIG. 12 is a vertical sectional view schematically illustrating the printed wiring board and the package substrate between which connector is inserted.
Figure 13:
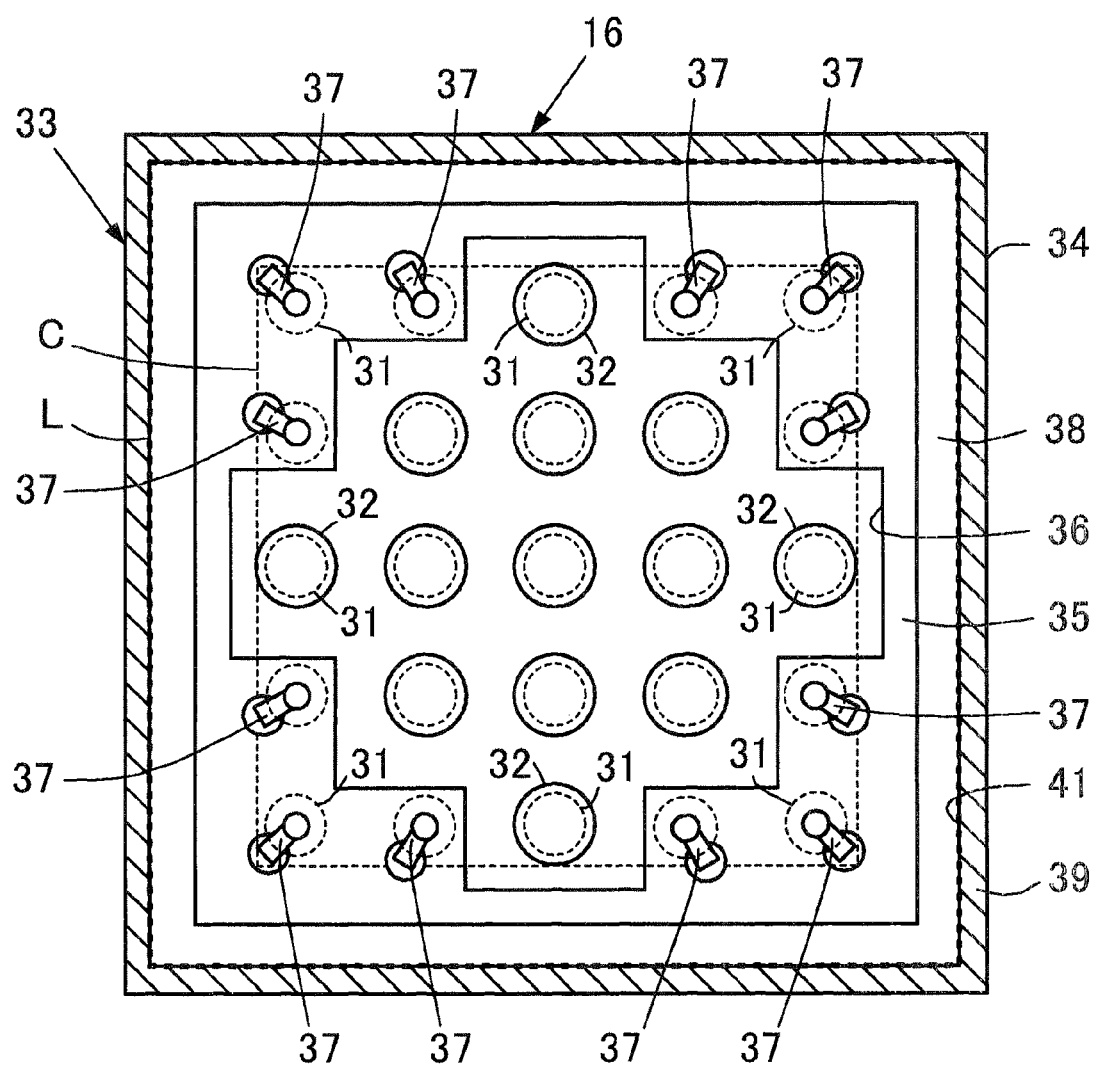
FIG. 13 is an enlarged sectional view of a structure of a printed wiring board unit according to a variation of the embodiments in accordance with aspects of the present invention.

Then, the first support frame 48 and the second support frame 49 are set as shown in FIG. 12. The second conductive terminals 37 are clipped with clips 51. Clip 51 may be, for example, a pair of plate springs. The plate springs may be affixed each other at one side. The first and second support frames 48 and 49 slide on a surface of printed wiring board 14. Clips 51 are situated between printed wiring board 14 and substrate 25. The first and second support frames 48 and 49 are slid until their restriction walls 41 hold the outer edge of package substrate 25 and then clips 51 are removed. Each end of the second conductive terminals 37 is pressed against conductive pads 29 and 31, respectively, with its elasticity. In this manner, mother board 13b is assembled.

For mother boards 13, 13a and 13b disclosed above, a plurality of the second conductive terminals 37 may be arranged in corners of quadrangular outline C. The shape of support plate 35 may be determined according to the arrangement of the second conductive terminals 37. The second conductive terminals 37 are arranged in each corner of the quadrangular outline, for example, symmetrical with respect to the center of an arrangement of the first conductive terminals 32. Arranged as describe above, the second conductive terminals 37 are reliably provide contact with conductive pads 29 and 31. Alternatively, the second conductive terminals 37 may be arranged along the outline of the quadrangular outline continuously.

Accordingly, aspects of the present invention provide the printed wiring board unit, semiconductor package, and the connector for the semiconductor package for maintaining a connection between a printed wiring board and electric circuit components regardless of thermally produced stresses.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments in accordance with aspects of the present inventions have been described in detail, it should be understood that the various changes, substitutions, and alterations could be made hereto without departing from the spirit and scope of the invention.

What is claimed is:

1. A printed wiring board unit, comprising: an electronic circuit component; a printed wiring board; a plurality of first conductive terminals disposed between the electronic circuit component and the printed wiring board, wherein at least one of the first conductive terminals is arranged along a quadrangular outline; and a plurality of second conductive terminals disposed between the electronic circuit component and the printed wiring board, wherein at least one of the second conductive terminals is arranged at a corner of the quadrangular outline, and wherein the plurality of second conductive terminals contacts at least one of the printed wiring board and the electronic circuit component in a relatively displaceable manner a connector frame having an aperture whose outline is modeled after the quadrangular outline, wherein the connector frame supports the second conductive terminal at a position corresponding to the corner of the quadrangular outline.

2. The printed wiring board unit according to claim 1, wherein the plurality of second conductive terminals includes an elastic member.

3. The printed wiring board unit according to claim 1, wherein the connector frame holds the electronic circuit component with an edge of the aperture, and wherein the connector frame includes:

a support frame having a bearing face defined along an outline modeled after an outline of the electronic circuit component and a positioning frame having a restriction wall vertically standing from an edge of the bearing face.

4. The printed wiring board unit according to claim 1, wherein the connector frame comprises a positioning member positioning the support frame with respect to the printed wiring board.

5. The printed wiring board unit according to claim 1, wherein the plurality of second conductive terminals are arranged at each corner of the quadrangular outline.

6. A semiconductor package, comprising:

a package substrate having a first surface and a second surface;

a semiconductor chip mounted on the first surface;

a plurality of first conductive terminals arranged at the second surface, at least one of the first conductive terminals being arranged along a quadrangular outline; and a plurality of second conductive terminals arranged at the second surface, the plurality of second conductive terminals being arranged at a corner of the quadrangular outline, and the plurality of second conductive terminals contacting the package substrate in a relatively displaceable manner.

7. A connector for a semiconductor package comprising:

a connector frame comprising an aperture having an outline modeled in the shape of a quadrangular outline; and a conductive terminal supported with the connector frame at a position corresponding to a corner of the quadrangular outline, wherein the conductive terminal includes an elastic member.

8. The connector according to claim 7, wherein the connector frame holds a package substrate of a semiconductor package with an edge of the aperture, the connector frame comprising:

a support frame having a bearing face defined along an outline modeled after an outline of the package substrate, and a positioning member having a restriction wall standing vertically from an edge of the bearing face.

9. The connector according to claim 7, wherein the conductive terminal is arranged at each corner of the quadrangular outline.

* * * * *